(12) United States Patent
Thorpe

(10) Patent No.: US 11,300,991 B2
(45) Date of Patent: Apr. 12, 2022

(54) CONTROL DEVICE FOR A HUMAN-MACHINE INTERFACE, COMPRISING ELECTROACTIVE ELEMENTS

(71) Applicant: ZODIAC AERO ELECTRIC, Montreuil (FR)

(72) Inventor: Thomas Thorpe, Montreuil (FR)

(73) Assignee: SAFRAN ELECTRONICS & DEFENSE COCKPIT SOLUTIONS, Montreuil (FR)

( * ) Notice: Subject to any disclaimer, the term of this patent is extended or adjusted under 35 U.S.C. 154(b) by 0 days.

(21) Appl. No.: 16/646,834

(22) PCT Filed: Sep. 12, 2018

(86) PCT No.: PCT/EP2018/074618
§ 371 (c)(1),
(2) Date: Mar. 12, 2020

(87) PCT Pub. No.: WO2019/053066
PCT Pub. Date: Mar. 21, 2019

(65) Prior Publication Data
US 2020/0272194 A1 Aug. 27, 2020

(30) Foreign Application Priority Data
Sep. 13, 2017 (FR) ...................... 1758481

(51) Int. Cl.
*G05G 9/04* (2006.01)
*G05G 9/047* (2006.01)
*H03K 17/95* (2006.01)

(52) U.S. Cl.
CPC ..... *G05G 9/04792* (2013.01); *H03K 17/9517* (2013.01); *G05G 2009/04707* (2013.01);
(Continued)

(58) Field of Classification Search
CPC ..... G05G 9/04792; G05G 2009/04707; H03K 17/9517; H02N 2/026; H02N 2/103; H02N 2/106; H02N 2/0065
(Continued)

(56) References Cited

U.S. PATENT DOCUMENTS 4,879,556 A * 11/1989 Duimel ................ G01D 5/2073
341/20
5,396,266 A * 3/1995 Brimhall ............. F15B 13/0422
335/215
(Continued)

FOREIGN PATENT DOCUMENTS

| EP | 2385518 A2 | 11/2011 |
| FR | 3036842 A1 | 12/2016 |
| WO | 0161431 A1 | 8/2001 |

OTHER PUBLICATIONS

International Search Report dated Nov. 9, 2018, issued in corresponding International Application No. PCT/EP2018/074618, filed Sep. 12, 2018, 5 pages.
(Continued)

*Primary Examiner* — Edwin A. Leon
*Assistant Examiner* — Iman Malakooti
(74) *Attorney, Agent, or Firm* — Christensen O'Connor Johnson Kindness PLLC

(57) ABSTRACT

A control device for a human-machine interface includes a base and a moveable member in the form of a lever or a push element, which can be moved relative to the base. The control device further includes at least one electroactive element positioned between the moveable member and a fixed element of the base.

9 Claims, 4 Drawing Sheets

(52) U.S. Cl.
 CPC .............. *G05G 2009/04733* (2013.01); *G05G 2009/04755* (2013.01); *G05G 2009/04766* (2013.01)

(58) Field of Classification Search
 USPC ........ 200/6 A; 310/319, 332, 334, 335, 339, 310/363, 364
 See application file for complete search history.

(56) References Cited

U.S. PATENT DOCUMENTS

| | | |
|---|---|---|
| 7,362,307 B2 | 4/2008 | Wu et al. |
| 10,187,058 B2 | 1/2019 | Simao |
| 2007/0262959 A1 | 11/2007 | Gu |
| 2009/0050465 A1* | 2/2009 | Asada .................... H01H 25/06 200/6 A |
| 2009/0058687 A1* | 3/2009 | Rothkopf .............. G06F 3/0485 341/20 |
| 2009/0212766 A1* | 8/2009 | Olson ...................... G05G 5/05 324/207.2 |

OTHER PUBLICATIONS

Written Opinion of the International Searching Authority dated Nov. 9, 2018, issued in corresponding International Application No. PCT/EP2018/074618, filed Sep. 12, 2018, 6 pages.

* cited by examiner

CONTROL DEVICE FOR A HUMAN-MACHINE INTERFACE, COMPRISING ELECTROACTIVE ELEMENTS

The present document relates, generally, to human-machine interfaces, in particular for aircraft, and relates more particularly to a control device for such an interface.

In one implementation, and in a nonlimiting manner, the invention relates to a control device of toggle switch or joystick type, advantageously Hall effect, for a human-machine interface of a digital panel for an aircraft cockpit.

The aircraft cockpit control panels are in fact provided with a certain number of control knobs which can be manipulated manually by the pilots to execute one or more controls on systems embedded on board the aircraft. The new generation of control knobs features, advantageously, Hall effect and, to this end, incorporates a bipolar element whose position is controlled upon the manipulation of the control device and means for detecting the magnetic field emitted by the bipolar element, composed of Hall effect sensors which ensure the measurement of the magnetic field emitted by the bipolar element.

Reference in this regard can be made to the document FR 3 036 842 which describes a universal control knob with Hall effect for an aircraft cockpit human-machine interface.

Toggle switches or joysticks conventionally comprise a handle which has an axis that is mobile according to one or more degrees of freedom relative to a mount.

In the case of a joystick, the axis is mobile relative to the mount according to two degrees of freedom, through a link of finger ball joint type. The axis can thus, for example, be able to be inclined according to two axes. The handle can also be mounted on the mount to rotate about its own axis to allow a manipulation of the handle according to a third degree of freedom through a link of ball joint type. A fourth degree of freedom can be obtained by allowing the displacement of the handle according to a movement of pull-push type through a link of linear-annular type.

In the document U.S. Pat. No. 7,362,307, the handle is mounted on the mount and has one or more elastomer elements in order to stress it into the position of rest.

In light of the above, one aim of the invention is to propose a control device for a human-machine interface whose use is configurable.

The subject of the invention is therefore a control device for a human-machine interface, comprising a mount and a member that is mobile relative to the mount, of handle or thruster type, and at least one electroactive element interposed between said member and a fixed element.

Thus, by providing an electroactive element acting on the mobile member of the device, the control device can be stressed into one or more positions. The control device can thus have several stable positions.

It is also possible to configure the control device so as to prohibit one or more degrees of freedom.

Moreover, the presence of the electroactive element makes it possible for a controlled system to take control of the device, through an activation of the electroactive element which prohibits or blocks a position, but also maintains or activates a position of the mobile member.

Thus, preferably, the electroactive elements constitute means for controlling the position of said member. The electroactive elements also constitute means for detecting the position of said member.

According to another feature, the mobile member comprises a set of at least one bipolar magnet, the mount comprising means for detecting the magnetic field emitted by the magnet.

A redundant detection of the position of the mobile member is thus obtained.

When the electroactive elements make it possible to control the position of the mobile member, its position can be stabilized on the basis of the information supplied by the Hall effect magnetic field detector. In these conditions, a component with stable positions is recreated in the same way as is proposed conventionally with an electromechanical component.

Advantageously, the detection means are suitable for detecting a rotational and/or translational displacement of the magnet.

In one embodiment, the mobile member comprises an axis and a radial annular flange ring mounted on the axis. The mount comprises a pair of fixed electrodes on either side of the flange ring, the electroactive elements comprising a set of electroactive blocks each interposed between one of the electrodes and an electrode linked to the flange ring and evenly distributed about the axis.

According to another feature, the electroactive elements comprise a set of electroactive cylindrical blocks disposed radially around the flange ring and coplanar to the flange ring, and placed between radially outer and inner biasing electrodes.

In this embodiment, the control device can comprise a set of electrical contact balls each interposed between the peripheral edge of the flange ring and a radially inner biasing electrode.

Advantageously, the peripheral edge of the flange ring is notched. It also comprises an electrical contact surface supplying power to the electrodes linked to the flange ring.

In one embodiment, the device comprises two pairs of two electroactive cylindrical blocks and two pairs of two diametrically opposite contact balls acting on the flange ring. The controlled system can thus block or release the rotation of the mobile member via an activation of the electroactive elements.

In an advantageous embodiment, the device comprises at least one proximity detector intended to detect a presence in proximity to the device and supply a detection signal to a control system.

Also, the subject of the invention, according to another aspect, is a method for controlling a mobile member of handle or thruster type, wherein at least one electroactive member interposed between said member and a fixed element is activated so as to provoke a change of mechanical state of the mobile member. Furthermore, according to this method, the position of the mobile member is detected by means of said electroactive member.

Other aims, features and advantages of the invention will become apparent on reading the following description, given purely as a nonlimiting example, and with reference to the attached drawings in which.

Figure 1:
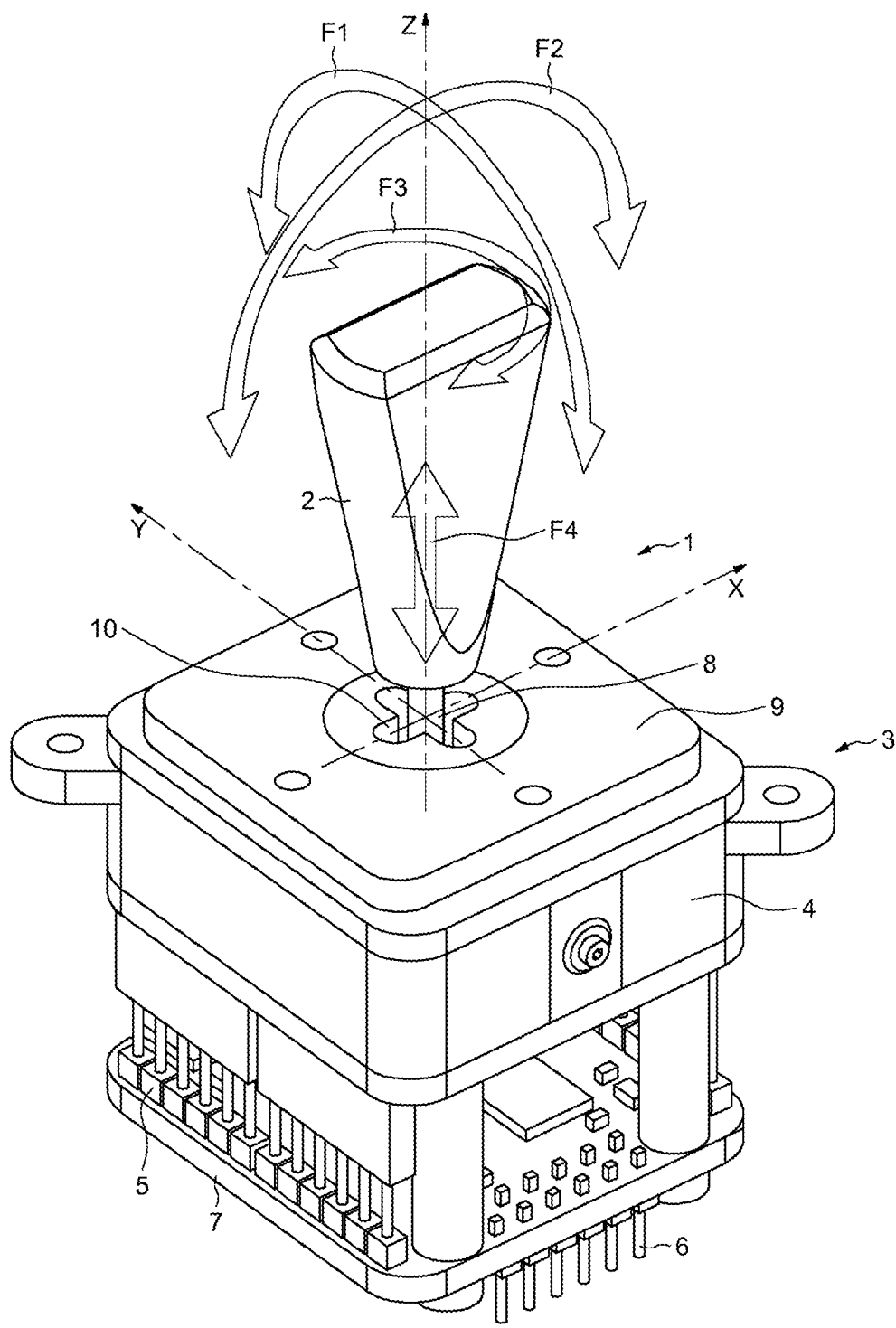
FIG. 1 is a perspective view of a control device according to the invention.

In FIGS. 1 to 4, a control device according to the invention is represented, denoted by the general numeric reference 1, represented in an assumed vertical position of use.

In the example illustrated in the figures, this control device constitutes a joystick which is intended to be mounted on a human-machine interface of an aircraft cockpit.

Obviously, there is no departure from the scope of the invention when the control device is intended to equip any other type of interface. Nor is there any departure from the scope of the invention when the control device adopts various actuation kinematics and constitutes, for example, a toggle switch or a pushbutton, or, generally, any type of manually-maneuverable member.

As illustrated in the figures, the device 1 comprises a handle 2 and a mount 3 on which the handle 2 is mounted. The mount 3 comprises a housing 4 provided with a set of contact pins 5, for example female, for electrically connecting the housing with the contact pins such as those 6 of a base 7, here male, which are mounted on female contact pins of a printed circuit board of the human-machine interface.

In the example illustrated in the figures, the control device 1 constitutes a joystick, the handle 2 being mounted on an axis 8 that is mobile relative to the mount according to four degrees of freedom illustrated by the arrows F1 to F4.

The mount 3 in fact comprises a top end plate 9 comprising a cross-form guiding gate 10 such that the axis 8 is mounted to pivot on the mount 3 about two right-angled and horizontal axes of rotation X and Y (arrows F1 and F2).

The axis 8 is moreover mounted so as to be axially rotationally mobile according to the vertical axis Z (arrow F3). It is finally mounted to be translationally mobile according to the vertical axis Z (arrow F4).

Obviously, the guiding gate can be configured so as to allow a pivoting of the handle in other directions. It can also be configured so as to allow a pivoting of the handle according to an angle of 360 degrees about its vertical axis.

Figure 2:
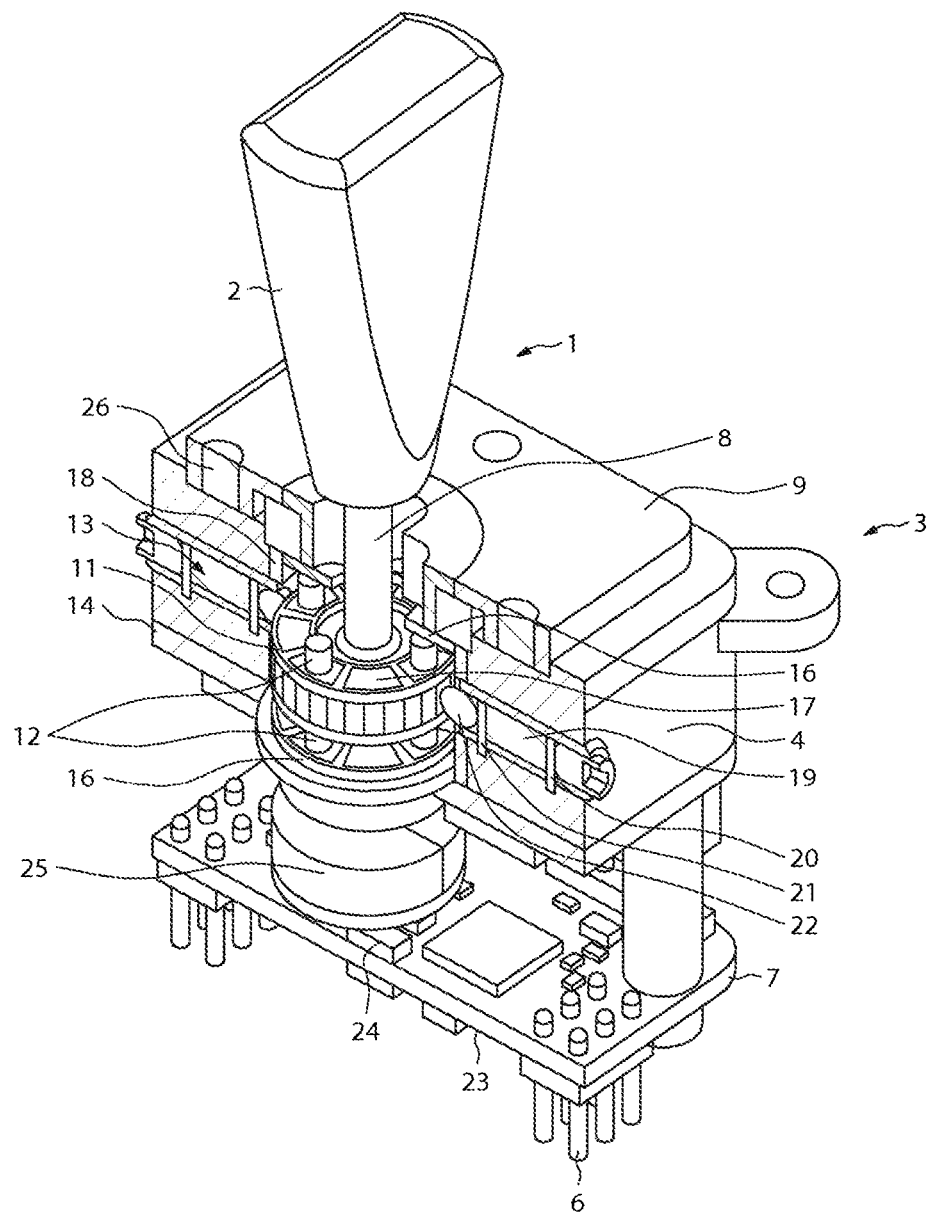
FIG. 2 is a perspective view, on a larger scale and in partial cross section, of the device of FIG. 1.
Figure 3:
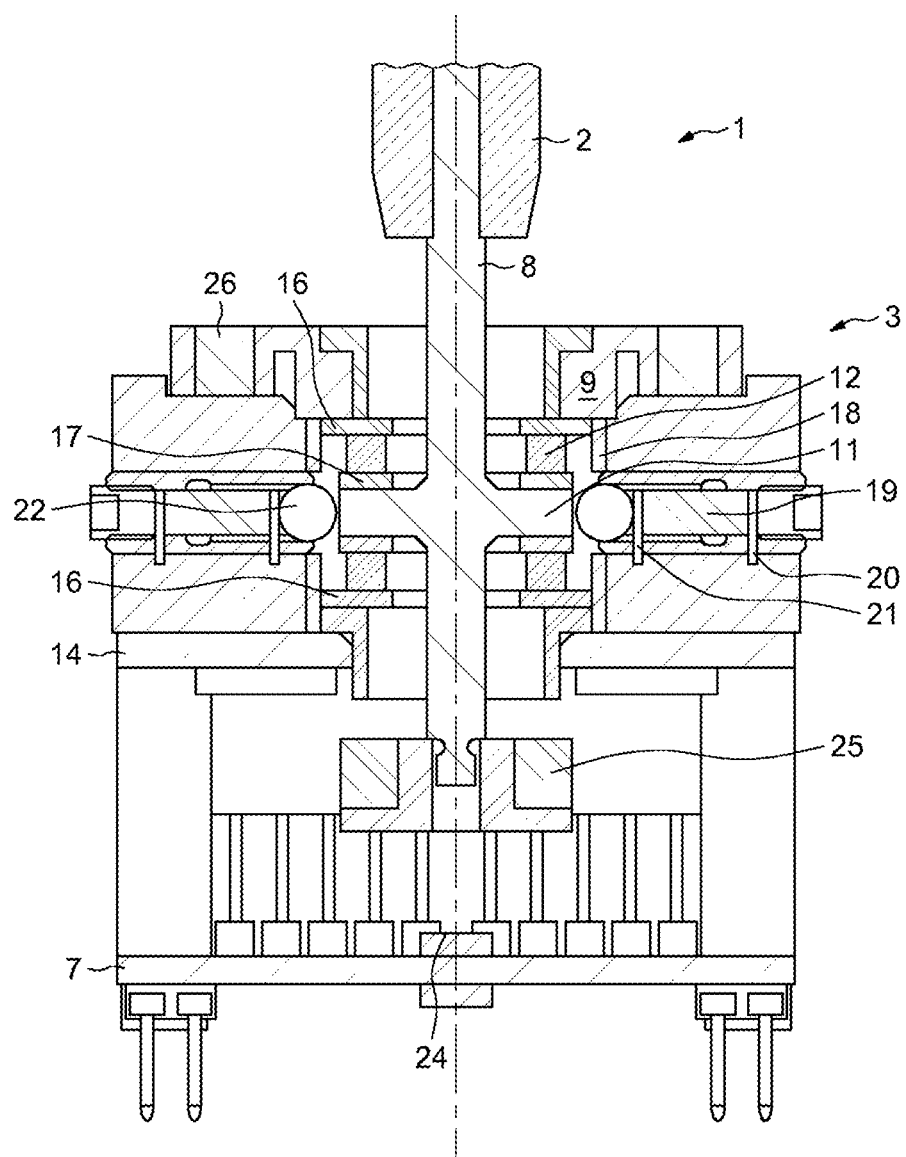
FIG. 3 is a side view in cross section of the device of FIG. 1.
Figure 4:
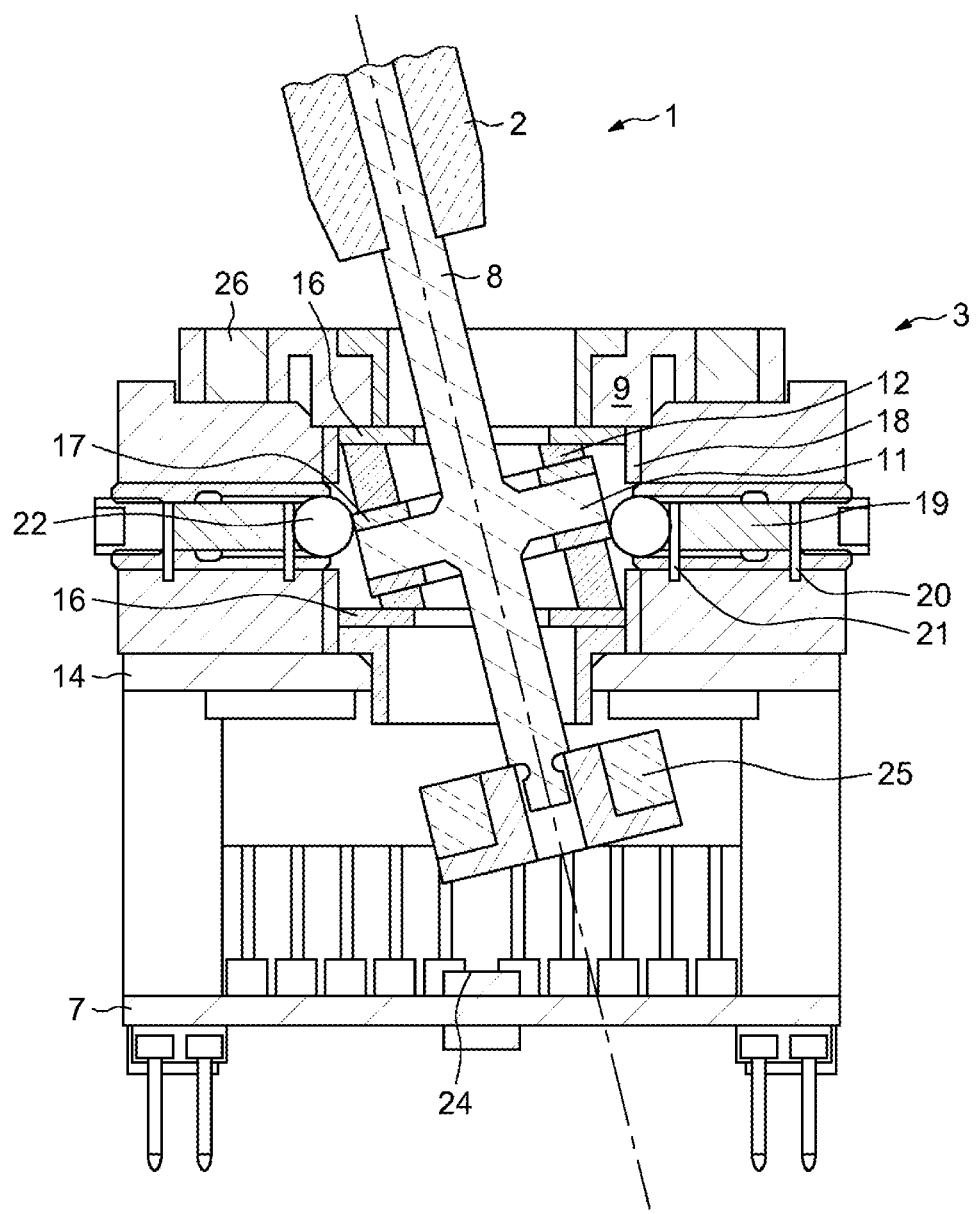
FIG. 4 shows the device of FIG. 3 upon the actuation of the handle.

Referring to FIGS. 2 and 3, the axis 8 of the handle 2 extends axially in the mount. It comprises an annular flange ring 11 provided in the median part of the axis, in the plane of the horizontal axes of rotation X and Y, in order, upon the inclination of the handle, for the flange ring to pivot about one of the axes X or Y, without any lateral displacement component.

The housing 4 of the mount 3 comprises, for its part, a set of electroactive elements 12 and 13 which cooperate with the median flange ring 11.

In a first implementation, the electroactive elements act on the flange ring in order, in particular, to stress it into the vertical position of rest and to restrict some or all of the degrees of freedom of the handle when an electrical field is applied to them.

The electroactive elements are each placed between electrodes, one fixed and the other linked to the flange ring, or that can be displaced under the action of the flange ring and are supplied with power by an electronic circuit board 14 so as to selectively bias the electroactive elements by creating an electrical field between the biasing electrodes and generate a consequential deformation of each electroactive element which acts on the flange ring 11.

In another implementation, that can possibly be combined with the first implementation, the electroactive elements are activated by the flange ring by being deformed via electrodes upon the manipulation of the handle and deliver a detection signal to the electronic circuit board 14. The processing of this signal makes it possible to identify the electroactive element to which a mechanical stress has been applied, and to detect the direction and the amplitude of the movement of the handle. This implementation makes it possible, for example, to ensure a redundancy in the detection of the actuation of the control device.

The electroactive elements are for example composed of elements made of a polymer, for example made of electroactive elastomer. In one embodiment, for example, use is made of a fluorinated polymer, such as PVDF (polyvinylidene fluoride), or a polymer derived from PVDF. Obviously, any other type of material suitable for the use envisaged can also be used as a variant.

They may be either piezoelectric or electrostrictive elements which undergo a second order deformation as a function of the electrical field which is applied to them such that electrical fields of opposite signs create one and the same deformation.

When the electroactive elements are used to detect the maneuvering of the handle, piezoelectric elements are used which generate currents if they are expanded or compressed.

Hereinbelow, and in the interests of clarity, it will be considered that the electroactive elements are used in the first implementation in which an electrical field is applied to them to provoke a mechanical deformation. However, the following description applies equally to the second implementation. In this case, the electronic circuit board 14 receives and analyzes the detection signals delivered by the electroactive elements to detect the movement and the amplitude of the movement of the handle.

In the exemplary embodiment illustrated in the figures, and as can be seen in particular in FIG. 3, the mount 3 comprises, on each side of the flange ring 11, an annular contact disk 16 which, in the first implementation, is an anodic contact disk, mounted on the top wall 9 of the housing 4 and a cathodic annular contact disk 17 fixed to the flange ring 11. An anodic cylinder 18 is mounted on the body of the mount, around the flange ring.

The anodic electrodes are fixed whereas the cathodic electrodes are mobile.

The electroactive elements then comprise a set of blocks 12, for example 8 of them, evenly distributed about the axis 8 between the anodic and cathodic contact disks 16 and 17.

The housing 4 also comprises a set of radial electroactive cylindrical blocks 19, here four of them, evenly distributed about the flange ring 11, in the plane thereof. They are positioned according to the axes of displacement X and Y of the handle.

They are each placed between two electrical contact electrodes 20 and 21, respectively anodic and cathodic, also connected to the board 14.

A contact ball 22 is interposed between each cathodic contact electrode 21 and the outer peripheral surface of the flange ring 11.

As can be seen in FIG. 2, preferably, this peripheral surface is notched, so as to allow an incremental rotation of the handle about its vertical axis Z.

Referring to FIG. 3, the base 7 of the mount also incorporates a power supply and processing board 23 which is connected to the board 14.

It comprises an axially positioned Hall effect sensor 24, whereas the free end of the axis 8 is provided with a set of bipolar magnets 25, the Hall effect sensor 24 constituting a means for detecting the magnetic field emitted by the magnets to detect a rotational and/or translational displacement of the magnets 25. As indicated previously, the electroactive elements can be used to allow a redundant detection of the actuation of the handle, together with the set formed by the sensor 24 and the magnets 25.

The set is complemented by a set of proximity detectors 26 provided in the top plate of the housing 4 of the mount and capable of detecting a presence and in particular the hand of a user.

These proximity detectors 26 are connected to a control system and deliver a detection signal in order, if necessary, to make it possible to lock the device when the maneuvering thereof is prohibited or to prohibit certain degrees of freedom.

The electroactive elements are firstly intended to stress the handle into the vertical position of rest by bringing it into this position of rest after actuation.

In fact, when the electroactive elements are not biased, they are compressed or expanded depending on the action performed on the axis 8.

When it involves a pivoting, the radial electroactive cylindrical blocks 19 and the blocks 12 are compressed or expanded. When it involves a push or pull type movement, only the blocks 12 are compressed or expanded depending on the direction of actuation.

The repositioning of the handle is performed either spontaneously under the effect of the elastic nature of the electroactive elements, or by being biased.

The electroactive polymers are moreover intended to be biased by the control system by being expanded and, thereby, by prohibiting one or more degrees of freedom of the knob.

One or more degrees of freedom, or all the degrees of freedom, can be blocked by biasing the electroactive elements.

This restriction can be provoked in response to the reception of a detection signal received from the presence detectors 26.

The invention which has just been described thus makes it possible to configure a control device of joystick type or of toggle switch type or of pushbutton type.

It also makes it possible to actively control the device by acting on the electroactive elements to maintain, prohibit or command a position of the handle.

Finally, the electroactive polymers can moreover be used to detect a maneuvering of the handle.

Thus, the present invention, which uses electroactive elements interposed between a mobile member of a control device of toggle switch type, of joystick type or of pushbutton type, makes it possible to configure the control device so as to block one or more, or even all, of the positions of the mobile member by appropriately sending an electrical pulse to the electroactive elements.

It also makes it possible to maneuver the mobile member without external manual intervention.

It also makes it possible to return the mobile member to the position of rest or, generally, into any predetermined position.

It finally makes it possible to favor, or on the other hand to restrict, access to certain maneuvers, by hardening certain electroactive elements so as to prioritize one maneuver over another.

The invention claimed is:

1. A control device for a human-machine interface, the control device comprising a mount, a member moveable relative to the mount, and at least one electroactive element positioned between the member and a fixed element of the mount, the member being a handle, the at least one electroactive element being configured to control a position of the member, the member comprising an axis and a radial annular flange ring mounted on the axis, first and second electrodes being linked to first and second sides, respectively, of the flange ring, the mount comprising third and fourth electrodes, the flange ring being positioned between the third and fourth electrodes, the at least one electroactive element comprising a set of electroactive blocks, each of the electroactive blocks being positioned between one of (1) the first and third electrodes, and (2) the second and fourth electrodes, the electroactive blocks being evenly distributed about the axis.

2. The control device according to claim 1, wherein the at least one electroactive element is configured to detect the position of the member.

3. The control device according to claim 1, wherein the member comprises at least one bipolar magnet, the mount comprising a sensor configured to detect a magnetic field emitted by the at least one magnet.

4. The control device according to claim 2, wherein the at least one electroactive element is configured to detect at least one of a rotational displacement and a translational displacement of the at least one magnet.

5. The control device according to claim 1, wherein the at least one electroactive further comprises a set of electroactive cylindrical blocks disposed radially around the flange ring and coplanar to the flange ring, the electroactive cylindrical blocks being positioned between radially outer and inner biasing electrodes.

6. The control device according to claim 5, further comprising a set of electrical contact balls, each of the electrical contact balls being positioned between a peripheral edge of the flange ring and a radially inner biasing electrode.

7. The control device according to claim 6, wherein the peripheral edge of the flange ring is notched.

8. The control device according to claim 5, further comprising two pairs of two electroactive cylindrical blocks and two pairs of two diametrically opposite contact balls acting on the flange ring.

9. The control device according to claim 1, further comprising at least one proximity detector configured to detect a presence in proximity to the device and to supply a detection signal to a control system.

* * * * *